(12) United States Patent
Vella-Coleiro

(10) Patent No.: US 7,197,085 B1
(45) Date of Patent: Mar. 27, 2007

(54) FREQUENCY-DEPENDENT MAGNITUDE PRE-DISTORTION FOR REDUCING SPURIOUS EMISSIONS IN COMMUNICATION NETWORKS

(75) Inventor: George P. Vella-Coleiro, Summit, NJ (US)

(73) Assignee: Andrew Corporation, Westchester, IL (US)

( * ) Notice: Subject to any disclaimer, the term of this patent is extended or adjusted under 35 U.S.C. 154(b) by 711 days.

(21) Appl. No.: 10/153,446

(22) Filed: May 22, 2002

Related U.S. Application Data

(60) Provisional application No. 60/367,399, filed on Mar. 25, 2002, provisional application No. 60/362,660, filed on Mar. 8, 2002.

(51) Int. Cl.
*H04L 25/49* (2006.01)
(52) U.S. Cl. .................................. 375/296; 375/297
(58) Field of Classification Search ......... 375/296–297
See application file for complete search history.

(56) References Cited

U.S. PATENT DOCUMENTS

| | | | | |
|---|---|---|---|---|
| 4,870,371 | A | 9/1989 | Gottwald et al. | |
| 4,890,300 | A | 12/1989 | Andrews | 375/60 |
| 5,132,639 | A * | 7/1992 | Blauvelt et al. | 330/149 |
| 5,187,719 | A * | 2/1993 | Birgenheier et al. | 375/226 |
| 5,361,156 | A | 11/1994 | Pidgeon | 359/161 |
| 5,872,814 | A | 2/1999 | McMeekin | 375/296 |
| 5,937,011 | A | 8/1999 | Carney et al. | 375/297 |
| 6,075,411 | A * | 6/2000 | Briffa et al. | 330/149 |
| 6,081,158 | A | 6/2000 | Twitchell et al. | 330/149 |
| 6,091,941 | A | 7/2000 | Moriyama et al. | 455/126 |
| 6,112,062 | A | 8/2000 | Hans et al. | |
| 6,141,390 | A | 10/2000 | Cova | 375/297 |
| 6,166,603 | A | 12/2000 | Smith | 330/263 |

(Continued)

FOREIGN PATENT DOCUMENTS

EP       0 416 622 A2    3/1991

(Continued)

OTHER PUBLICATIONS

"A simplex method for function minimization", by J.A. Nelder and R. Mead, Computer Journal, vol. 7 (1965), pp. 308-313.

(Continued)

*Primary Examiner*—Kevin Burd
*Assistant Examiner*—Freshteh N Aghdam
(74) *Attorney, Agent, or Firm*—Steve Mendelsohn

(57) ABSTRACT

Pre-distortion, whose magnitude—and preferably phase—are frequency-dependent, is applied to an input signal in order to reduce spurious emissions resulting from subsequent amplification of the signal. In preferred embodiments, the pre-distortion technique of the present invention is implemented in combination with the (frequency-independent) magnitude and phase pre-distortion technique described in U.S. patent application Ser. No. 09/395,490 ("the '490 application"), where the frequency-dependent pre-distortion corresponds to amplifier distortion that has a magnitude that is proportional to the frequency offset from the carrier frequency and a phase shift of ±90° on either side of the carrier frequency. Since these characteristics match those of a differentiator, a thorough correction of this part of the amplifier's distortion can be achieved using a differentiating filter. Embodiments of the present invention may be implemented in the baseband domain. Implementations may also be based on look-up tables that are adaptively updated to ensure optimal performance over time.

27 Claims, 11 Drawing Sheets

U.S. PATENT DOCUMENTS

| | | | |
|---|---|---|---|
| 6,194,942 B1 | 2/2001 | Yu et al. | 327/317 |
| 6,236,267 B1 | 5/2001 | Anzil | 330/149 |
| 6,271,724 B1 | 8/2001 | Neffling | 330/149 |
| 6,275,103 B1 * | 8/2001 | Maniwa | 330/149 |
| 6,281,747 B2 | 8/2001 | Ahuja et al. | 330/109 |
| 6,288,610 B1 | 9/2001 | Miyashita | 330/149 |
| 6,288,814 B1 | 9/2001 | Blauvelt | 359/180 |
| 6,304,140 B1 | 10/2001 | Thron et al. | 330/149 |
| 6,342,810 B1 * | 1/2002 | Wright et al. | 330/51 |
| 6,366,177 B1 | 4/2002 | McCune et al. | 330/103 |
| 6,373,902 B1 | 4/2002 | Park et al. | 375/296 |
| 6,400,415 B1 | 6/2002 | Danielsons | 348/608 |
| 6,417,731 B1 | 7/2002 | Funada et al. | 330/149 |
| 6,429,736 B1 | 8/2002 | Parry et al. | 330/2 |
| 6,438,186 B1 | 8/2002 | Strait | 375/354 |
| 6,489,846 B2 | 12/2002 | Hatsugai | 330/149 |
| 6,512,417 B2 | 1/2003 | Booth et al. | 330/149 |
| 6,587,514 B1 | 7/2003 | Wright et al. | |
| 6,677,820 B2 | 1/2004 | Miyatani | 330/149 |
| 6,683,495 B2 | 1/2004 | Johnson et al. | 330/52 |
| 6,687,511 B2 | 2/2004 | McGowan et al. | 455/522 |
| 6,700,442 B2 | 3/2004 | Ha | 330/124 R |
| 6,794,936 B2 | 9/2004 | Hsu et al. | 330/149 |
| 6,798,843 B1 | 9/2004 | Wright et al. | 375/296 |
| 6,885,709 B1 | 4/2005 | Dartois | 375/297 |
| 6,903,604 B2 | 6/2005 | Kim | 330/2 |
| 6,925,106 B2 | 8/2005 | Horaguchi et al. | 375/146 |
| 6,975,687 B2 | 12/2005 | Jackson et al. | 375/297 |
| 2001/0033238 A1 | 10/2001 | Velazquez | |
| 2002/0041210 A1 | 4/2002 | Booth et al. | 330/149 |
| 2002/0060606 A1 * | 5/2002 | Andre | 330/149 |
| 2002/0065048 A1 | 5/2002 | Nagatami et al. | 455/63 |
| 2002/0080891 A1 | 6/2002 | Ahn et al. | 375/297 |
| 2002/0085647 A1 | 7/2002 | Oishi et al. | 375/297 |
| 2002/0125947 A1 | 9/2002 | Ren | 330/149 |
| 2002/0171485 A1 | 11/2002 | Cova | 330/149 |
| 2002/0186783 A1 | 12/2002 | Opas et al. | 375/297 |
| 2003/0016741 A1 | 1/2003 | Sasson et al. | 375/229 |
| 2003/0020538 A1 | 1/2003 | Kim | 330/2 |
| 2003/0045264 A1 | 3/2003 | Jeong et al. | 455/323 |
| 2003/0058960 A1 | 3/2003 | Lee | 375/297 |
| 2003/0076894 A1 | 4/2003 | Jin et al. | 375/296 |
| 2003/0076896 A1 | 4/2003 | Ball et al. | 375/297 |
| 2003/0117215 A1 | 6/2003 | O'Flaherty et al. | 330/149 |
| 2003/0227981 A1 | 12/2003 | Vella-Coleiro et al. | 375/297 |
| 2004/0041628 A1 | 3/2004 | Okubo et al. | 330/149 |
| 2004/0122627 A1 | 6/2004 | Kybett et al. | 702/189 |
| 2004/0264597 A1 | 12/2004 | Vella-Coleiro | 375/297 |
| 2005/0088230 A1 | 4/2005 | Johnson et al. | 330/149 |

FOREIGN PATENT DOCUMENTS

| | | |
|---|---|---|
| EP | 1 085 668 A2 | 3/2001 |
| EP | 1 199 797 A1 | 4/2002 |
| EP | 1 280 273 A2 | 1/2003 |
| EP | 1 463 198 A2 | 9/2004 |
| GB | 2 348 755 A | 10/2000 |
| GB | 2 384 377 A | 7/2003 |
| WO | WO 03/085822 A1 | 10/2003 |

OTHER PUBLICATIONS

"An Efficient Adaptive Predistorter for Nonlinear High Power Amplifier in Satellite Communication", by Kang H.W. et al., 1997 IEEE International Symposium on Circuits and Systems, Jun. 9-12, 1997, pp. 228-2291, XP-0000804798, New York.

"Communication Systems—Third Edition", by Carlson A.B., 1986, McGraw-Hill, Singapore XP-002245318; pp. 194-200.

* cited by examiner

FREQUENCY-DEPENDENT MAGNITUDE PRE-DISTORTION FOR REDUCING SPURIOUS EMISSIONS IN COMMUNICATION NETWORKS

CROSS-REFERENCE TO RELATED APPLICATIONS

This application claims the benefit of the filing date of provisional application Nos. 60/362,660, filed on Mar. 8, 2002, and 60/367,399, filed on Mar. 25, 2002. The subject matter of this application is related to the subject matter of (a) U.S. patent application Ser. No. 09/395,490, filed on Sep. 14, 1999 ("the '490 application"), (b) U.S. patent application Ser. No. 10/068,343, filed on Feb. 5, 2002, and (c) U.S. patent application Ser. No. 10/153,289, filed on the same date as the present application, the teachings of all of which are incorporated herein by reference.

BACKGROUND OF THE INVENTION

1. Field of the Invention

The present invention relates to signal processing, and, in particular, to the pre-distortion of signals for transmission, for example, in a wireless communication network, to reduce spurious emissions.

2. Description of the Related Art

Modern wireless communication networks employ complex modulation schemes that necessitate tight control of spurious emissions (sometimes called "out-of-band emissions") in order to avoid interfering with neighboring carriers and to comply with the requirements of regulatory bodies (e.g., FCC) and standards bodies (e.g. ITU). One source of spurious emissions is the base station transmitter amplifier that is used to amplify signals prior to transmission as wireless (e.g., RF) signals to wireless (e.g., mobile) units in a wireless communication network, such as a cellular voice and/or data network. Prior art techniques for reducing such spurious emissions were able to satisfy previous requirements. However, recent developments in wireless communication networks (e.g., Universal Mobile Telecommunication Service (UMTS)) place additional burden on the base station transmitter amplifier and make it advantageous to reduce the spurious emissions even further.

SUMMARY OF THE INVENTION

Embodiments of the present invention are directed to techniques that reduce spurious emissions in wireless communication networks to levels that satisfy current requirements. In particular, embodiments of the present invention involve pre-distortion, whose magnitude—and preferably phase—are frequency-dependent, that is applied to an input signal to generate a pre-distorted signal that, when applied to an amplifier, results in lower spurious emissions in the resulting amplified signal.

In one embodiment, the present invention is a method for reducing spurious emissions in an amplified signal, comprising the steps of (a) receiving an input signal; and (b) applying pre-distortion, whose magnitude is frequency-dependent, to the input signal to generate a pre-distorted signal, such that, when the pre-distorted signal is applied to an amplifier to generate the amplified signal, the pre-distortion reduces spurious emissions in the amplified signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

The '490 application describes a technique for reducing spurious emissions using digital pre-distortion that was sufficient to meet previously existing regulations and standards. According to the '490 application, pre-distortion, whose magnitude and phase are frequency-independent, is applied to an input signal to generate a (main) pre-distorted signal that reduces spurious emissions when the pre-distorted signal is subsequently amplified by an amplifier. According to embodiments of the present invention, pre-distortion, whose magnitude—and preferably phase—are frequency-dependent, is applied to generate an additional (i.e., secondary) pre-distortion signal that, when combined with the main pre-distorted signal described in the '490 application, can further reduce spurious emissions in the amplified signal. The following section provides a description of the pre-distortion technique taught in the '490 application. Following that is a description of different possible implementations of a pre-distortion component, whose magnitude and phase are frequency-dependent, that is preferably combined with—but does not necessarily have to be combined with—the pre-distortion technique of the '490 application to further reduce spurious emissions in communications networks.

Pre-Distortion Technique of the '490 Application

The pre-distortion technique described in the '490 application reduces adjacent channel power in wireless communication networks. In particular, the '490 application describes a technique for digitally and adaptively pre-distorting an outgoing signal that involves applying a correction to the signal before it is applied, e.g., to the input of a base station transmitter amplifier, such that the correction is equal and opposite to at least some of the anticipated distortion produced by the amplifier. The correction causes at least some of the amplifier distortion to be canceled, resulting in a base station transmitter having a more linear transfer characteristic than a corresponding transmitter without such pre-distortion. In these circumstances, the adjacent channel power (i.e., spurious emission) is desirably reduced.

Figure 1:
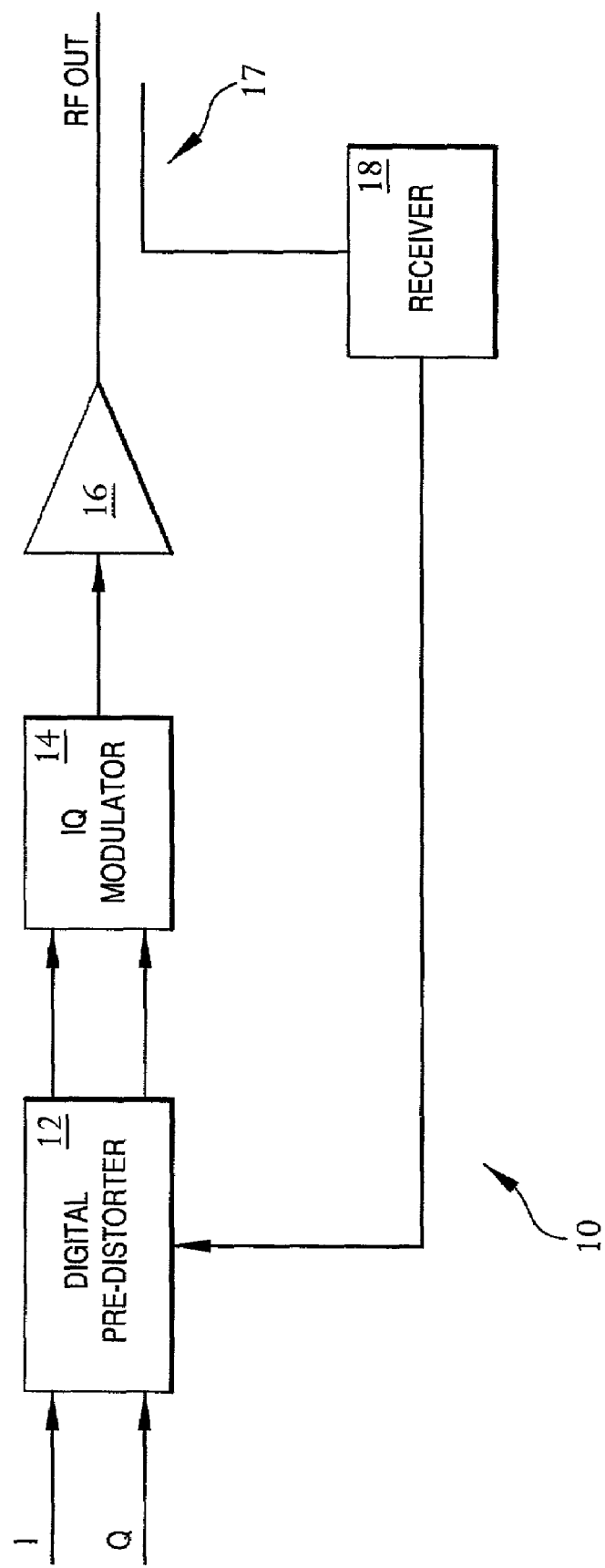
FIG. 1 shows a block diagram of a system, in accordance with the (frequency-independent) pre-distortion technique described in the U.S. application Ser. No. 09/395,490.

FIG. 1 shows a block diagram of a system 10, in accordance with the pre-distortion technique described in the '490 application. System 10 includes a digital pre-distorter 12 for receiving the in-phase (I) and quadrature (Q) components of an input digital baseband signal, an IQ modulator 14 connected to the output of pre-distorter 12, an amplifier 16 connected to the output of modulator 14, and a receiver 18 that is coupled to the output of amplifier 16 through a coupler 17 in order to generate a control signal that is fed back to pre-distorter 12. These components are configured to apply a correction to the input digital baseband signal (e.g., a code division multiple access (CDMA) signal, a wideband CDMA signal, a time division multiple access (TDMA) signal, an enhanced data rates through global system for mobile communications evolution (EDGE) signal, or other signal, preferably with a substantially large peak power to average power ratio) generated by a communication device—such as a base station used for transmitting wireless communication data—and applied to pre-distorter 12 as the input signal (I, Q). System 10 also provides adaptive feedback through receiver 18 to optimize the correction.

More specifically, this pre-distortion technique comprises applying a correction to a digital baseband signal before the signal is applied to an input of amplifier 16 such that the correction is opposite to at least a portion of the distortion produced by amplifier 16. Thus, the correction and some portion of the amplifier distortion cancel one another, resulting in a system with a more linear transfer characteristic. In system 10, in order to take advantage of the precision and low cost of digital circuits, digital pre-distorter 12 preferably performs its correction at baseband, before the signal is converted by modulator 14 to radio frequency (RF) for amplification and transmission.

According to this pre-distortion technique, pre-distorter 12 pre-distorts both the magnitude and the phase of the input signal as a function of the signal power (but independent of frequency). Since both the magnitude and phase corrections vary with the instantaneous power (i.e., envelope power), pre-distorter 12 relies on accurate descriptions of the amplifier magnitude and phase variations with power level to perform its function. As will be described below, the functional representation of the corrections (versus power level) are in the form of polynomial equations from which a look-up table is preferably derived.

More particularly, the digital baseband signal is comprised of discrete time samples of in-phase (I) and quadrature (Q) components which, after digital-to-analog conversion (not shown), are applied to the vector IQ modulator 14 to generate an RF signal that is then input to amplifier 16. Each sample for the baseband signal can be represented in complex number notation as (I+jQ), where j is the square root of (−1). The pre-distortion operation of pre-distorter 12 can be represented according to Equations (1)–(3) as follows:

$$I'+jQ'=(I+jQ)(A+jB) \qquad (1)$$

where $$I'=IA-QB \qquad (2)$$

$$Q'=QA+IB \qquad (3)$$

where I' and Q' are the pre-distorted in-phase and quadrature baseband signals generated by pre-distorter 12, and A and B are pre-distortion parameters that are a function of the instantaneous envelope power of the input signal represented by I and Q. Conveniently, different values for parameters A and B may be stored in a look-up table (which is generated as described below) with the index being the instantaneous envelope power given by $(I^2+Q^2)$.

Figure 2:
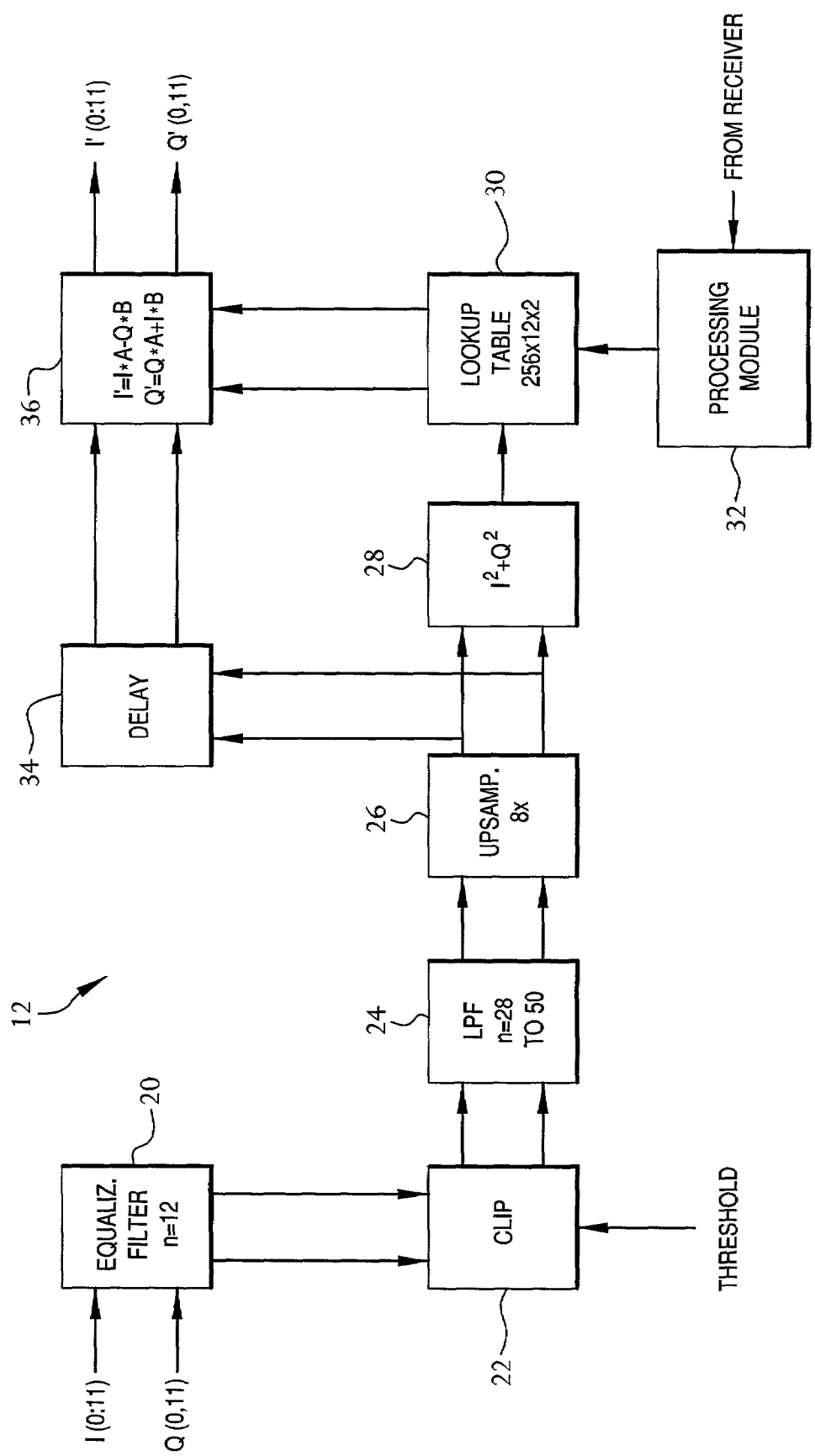
FIG. 2 shows a block diagram of the digital pre-distorter of FIG. 1.

FIG. 2 shows a block diagram of digital pre-distorter 12 of FIG. 1, in accordance with the pre-distortion technique of the '490 application. As shown in FIG. 2, pre-distorter 12 includes an equalization filter 20 for receiving the signal that is comprised of the in-phase and quadrature components described above. The equalization filter is a component that is well known in the art and is operatively connected to a clipping module 22 that clips the signal to a predetermined threshold. The output of clipping module 22 is fed to a low-pass filter 24 that eliminates the high-frequency components that are generated during clipping.

The output of low-pass filter 24 is fed to a sampling module 26 that provides an up-sampled signal (e.g., increases the sampling rate by a factor of four from an original 2× rate to an 8× rate) to an index calculating module 28, which calculates an index value based on the sum of the squares of the in-phase and quadrature components of the baseband signal. Index calculating module 28 is connected to a look-up table 30 having stored therein parameters A and B. Values for parameters A and B are retrieved based on the calculated index value.

The pre-distortion parameters A and B of look-up table 30 are derived from a set of polynomial equations that closely approximate the corrections used to linearize the amplifier characteristics. Because of the complex nature of the characteristics of amplifiers, such as class AB amplifiers, advantageous results are obtained by using a pair of polynomial equations for parameter B, while a single polynomial equation is sufficient for parameter A. (As an approximation, it can be said that parameter A corrects the magnitude distortion of the amplifier, while parameter B corrects the phase distortion.) These polynomial equations can be written according to Equations (4)–(7) as follows:

$$A=C_0+C_1P+C_2P^2+C_3P^3 \text{ for } A \leq A_m \qquad (4)$$

$$A=A_m \text{ otherwise} \qquad (5)$$

$$B=C_4P+C_5P^2+C_6P^3 \text{ for } P \leq P_b \qquad (6)$$

$$B=(B_{b1}-B_{b2})+C_7P+C_8P^2+C_9P^3 \text{ for } P>P_b \qquad (7)$$

where $P=(I^2+Q^2)$ is the instantaneous envelope power. $A_m$ is a maximum value imposed on parameter A to prevent the amplifier from being driven deep into saturation. A typical value for $A_m$ is 2, but it can vary depending on the detailed design. $P_b$ is a breakpoint where parameter B transitions between Equations (6) and (7). $P_b$ is an optimizable parameter whose value is obtained by the optimization algorithm. The value varies from amplifier to amplifier. It can also vary with temperature. $B_{b1}$ and $B_{b2}$ are the values of parameter B at $P=P_b$ using Equations (6) and (7), respectively. The first term on the right-hand side of Equation (7) is intended to make Equations (6) and (7) continuous at $P=P_b$. $C_0$ through $C_9$ are coefficients that pertain to the transfer function characteristics of a particular amplifier and which can vary with temperature, aging of the amplifier components, etc. As with $P_b$, the optimization algorithm finds values for coefficients $C_0$ through $C_9$ that give optimized results.

Of course, it should be appreciated that, in appropriate circumstances, two polynomial equations may be used for parameter A as well as for parameter B. Furthermore, in many instances it is possible to reduce Equations (4) and (6) to exclude terms higher than the linear P term, resulting in Equations (4')–(7') as follows:

$$A = C_0 + C_1 P \text{ for } P \leq P_b \quad (4')$$

$$A = (A_{b1} - A_{b2}) + C_2 P + C_3 P^2 + C_4 P^3 \text{ for } P > P_b \quad (5')$$

$$B = C_5 P \text{ for } P \leq P_b \quad (6')$$

$$B = (B_{b1} - B_{b2}) + C_6 P + C_7 P^2 + C_8 P^3 \text{ for } P > Pb \quad (7')$$

where $A_{b1}$ and $A_{b2}$ are the values of parameter A at $P=P_b$ using Equations (4') and (5'), respectively. As before, a maximum limit $A_m$ can be placed on the value of parameter A. Also, if necessary, the breakpoint $P_b$ where the transition is made from one polynomial equation to the other can have a different value for the A equations than for the B equations.

To accommodate the time-varying nature of the coefficients (e.g., $C_0$–$C_9$ in Equations (4)–(7)), an adaptive scheme is employed in this pre-distortion technique whereby the values of the coefficients are at least intermittently optimized (or operated on) to maintain minimum or reduced spurious emissions. Referring again to FIG. 1, coupler 17 at the output of amplifier 16 samples the output and receiver 18, which is tuned to the frequency region where the spurious emissions are to be reduced or minimized, generates a voltage proportional to the received power. Multiple receivers can be used to sample the spurious emissions at more than one frequency or a single receiver can tune sequentially to the different frequencies of interest. The voltages obtained at the different frequencies are then combined into a single quantity whose value is to be reduced or minimized. When two frequencies are used, which is generally sufficient, the resultant voltages, $V_1$ and $V_2$, can be combined according to Equation (8) as follows:

$$V = V_1 + V_2 + |(V_1 - V_2)| \quad (8)$$

where $|(V_1-V_2)|$ is the absolute value of $(V_1-V_2)$. Such use of an absolute value causes both $V_1$ and $V_2$ to be reduced or minimized, instead of simply providing the sum of the two values. If only the first two terms on the right-hand side of Equation (8) were used, the algorithm might find a false optimum by making one voltage very small and the other quite large. An alternative to Equation (8) is V=max ($V_1$, $V_2$), where max means choose the larger of the values.

A suitable algorithm to find the values of the coefficients that reduce or minimize V, and thus the spurious emissions, is the well-known simplex algorithm, described by Nelder and Mead in "A Simplex Method For Function Minimization," Computer Journal, Vol. 7, pp. 308–313 (1965), which is incorporated herein by reference. As will be described below, the algorithm is implemented in modified form.

Referring again to FIG. 2, based on the feed-back signal from receiver 18 of FIG. 1, processing module 32 implements the modified simplex algorithm to update the values of parameters A and B stored in look-up table 30. It should be appreciated that processing module 32 may take a variety of forms such as a microprocessor, a digital signal processor, or a processing circuit using FPGA devices. It should be further appreciated that the simplex algorithm may be implemented in any suitable manner that utilizes appropriate combinations of hardware and software that will be apparent to those of skill in the art upon a reading hereof. Of course, the device used to implement the algorithm (here, module 32) should include suitable storage capacity to store and maintain the code and data necessary to run the algorithm.

At each iteration, the values of the coefficients derived by the algorithm are used in the equations for A and B described above to generate a table which is used by the algorithm for the next iteration. The algorithm is allowed to run continuously, or at least intermittently, so that the coefficient values track changes that occur over time.

The simplex optimization algorithm as developed by Nelder and Mead was intended for minimizing or reducing function values, which were obtained by mathematical computations. An important aspect of this mode of operation is that, if a computation is repeated, the same function value is obtained. This contrasts with values obtained by measurements on operating hardware where noise and fluctuations inevitably result in varying measured values. This difference has an important consequence when an attempt is made to use the simplex algorithm in real time on operating hardware. The essence of the simplex algorithm is that, at each iteration, the set of coefficients that is associated with the worst function value is replaced with a new set which gives a better function value. This new value might or might not be better than the best function value obtained up to that time, but as the algorithm progresses it is expected that better and better function values will be obtained. Suppose that, as a result of noise and fluctuations in the measurements, an exceptionally good but erroneous value is obtained. If subsequent values obtained are all worse than this erroneous value, then the algorithm will converge on the erroneous value. Thus, in its conventional form, the algorithm is not very suitable for use in situations where considerable fluctuations exist in the quantity being optimized or operated on as may be in the present case.

To circumvent this difficulty, the simplex algorithm is used in modified form. At the end of each iteration, if the previous best value is replaced by a better value, then the algorithm proceeds to the next iteration. However, if an iteration does not yield a new best value, then the existing best point is re-evaluated and the new value is substituted for the previous one. Thus, the algorithm is able to recover from erroneous data due to fluctuating measurements. These fluctuations may result in a larger number of iterations in order to reach a desired point (which could be an optimum point), but will not prevent the desired point from being reached.

Another modification of the simplex algorithm enables it to operate continuously to track changes in amplifier characteristics caused by temperature changes, aging of components, or other disturbances. In the conventional implementation of the algorithm, an exit criterion is established (the criterion is usually related to the fractional variation of the function values between the worst and best points of the simplex) and the algorithm terminates when the criterion is satisfied. As the desired or optimum point is approached, the algorithm reduces the size of the simplex which typically becomes very small by the time the desired point is reached. Once this happens, the algorithm is no longer able to react to changes in amplifier characteristics.

In preferred implementations, the size of the simplex is prevented from becoming too small by comparing it to a value, such as a preset minimum value, at the start of each iteration and increasing the size to the value if it has been reduced below it. The value is chosen such that it is large enough to enable the algorithm to track changes in the amplifier characteristics but not so large that the desired (or optimum) point cannot be reached. A suitable value is one where the value of each coefficient at the worst point of the simplex differs from the corresponding value at the best point by 5 to 10 percent.

With continuing reference to FIG. 2, the output of sampling module 26 is also connected to a delay circuit 34, which is, in turn, connected to an output module 36 that generates an output signal based on the values of parameters A and B retrieved from look-up table 30 and the delayed upsampled signal from delay circuit 34. The delay applied by delay circuit 34 is preferably equivalent to the delay involved in performing the processing of modules 28 and 30 so that the appropriate values of (I and Q) and (A and B) arrive at output module 36 at the same time.

Figure 3:
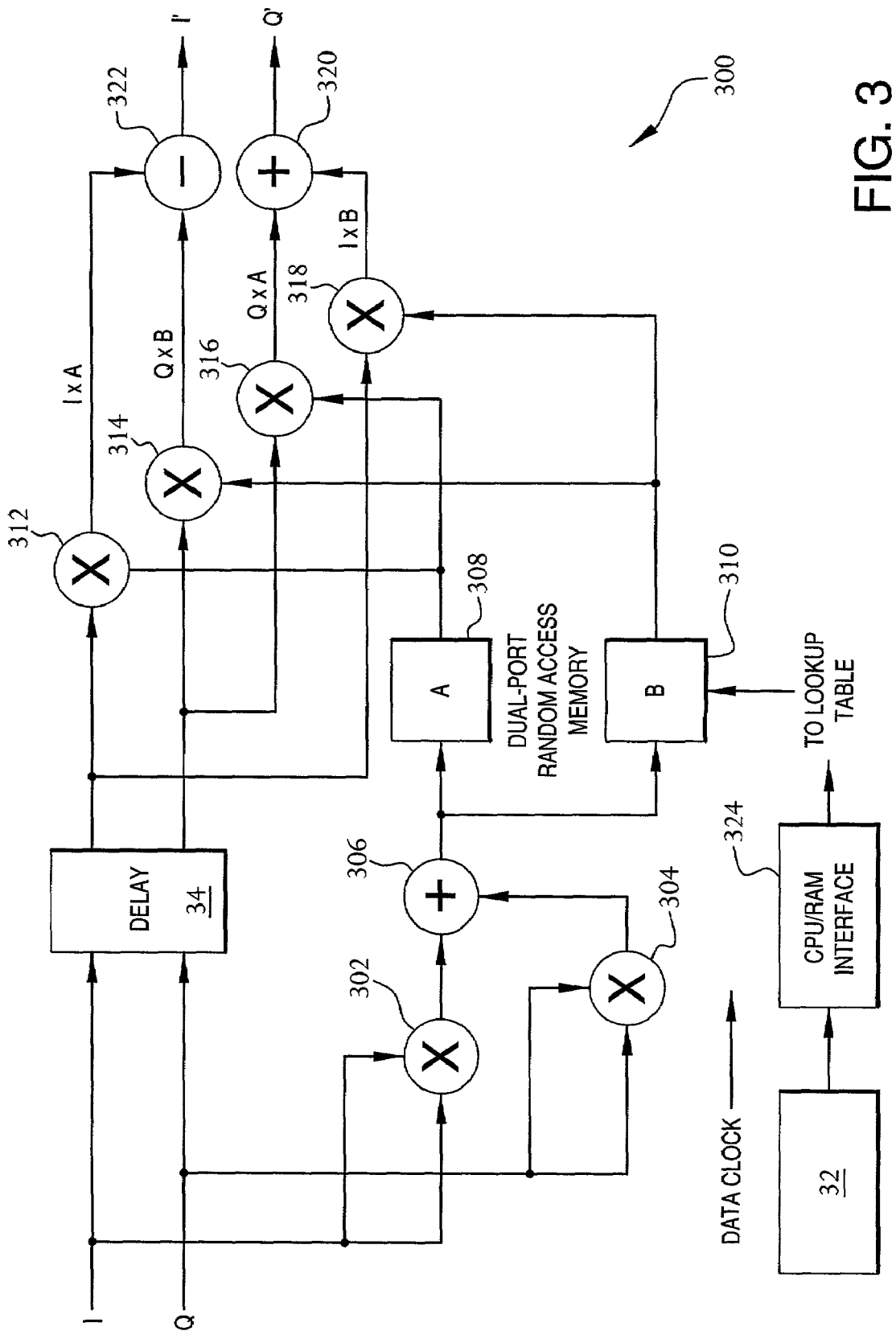
FIG. 3 shows a block diagram of an exemplary FPGA implementation of the index calculating module, the delay block, the look-up table, and the output module of FIG. 2.

FIG. 3 shows a block diagram of an exemplary FPGA implementation 300 of index calculating module 28, delay 34, look-up table 30, and output module 36 of FIG. 2. The I and Q data paths are independently squared at multipliers 302 and 304 to create $I^2$ and $Q^2$, respectively. These two values are added together at adder block 306 to form an index address for look-up table 30, which, in FIG. 3, takes the form of two separate dual-port RAM memory blocks 308 and 310, which contain the parameters A and B, respectively. The parameters output from the memory blocks are multiplied by the delayed I and Q values at multipliers 312, 314, 316, and 318 to create the four values I×A, I×B, Q×A, and Q×B. These are combined by adder and subtractor blocks 320 and 322 to form (IA−QB) and (QA+IB), respectively, which are output as I' and Q'.

Additional circuitry 324 loads the dual-port memory blocks 308 and 310 with parameter data generated in processing module 32 using standard memory interface signals. The use of dual-port memory permits real-time updating of the look-up tables without disrupting the accessing of parameter values by the pre-distortion process.

A look-up table configuration is not necessary where, for example, the processing module has a sufficiently high processing speed to allow for the obtaining of the A and B parameters on an "as needed" basis. In this case, the processing module calculates the appropriate coefficients and the A and B parameters are subsequently calculated by the processing module as needed or desired without storing such parameters in a look-up table.

Referring again to FIG. 1, receiver 18 in the digital pre-distortion adaptive feedback loop is used to measure the RF power over a narrow bandwidth at a specific frequency. This tuned frequency is offset from, for example, the main CDMA carrier frequency and is a frequency where the spurious emissions are to be minimized by the optimization algorithm.

Figure 4:
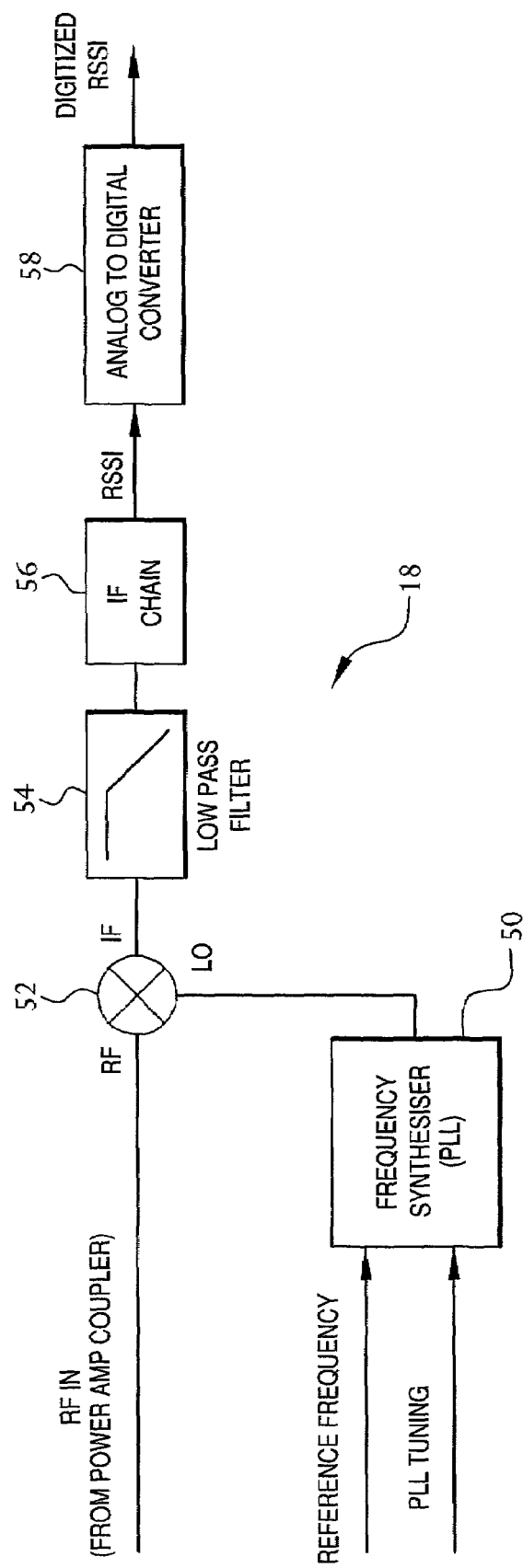
FIG. 4 shows a block diagram of an exemplary single-channel, single-conversion implementation of the receiver of FIG. 1.

FIG. 4 shows a block diagram of an exemplary single-channel, single-conversion implementation of receiver 18 of FIG. 1. In this implementation, receiver 18 includes a frequency synthesizer 50, which is connected to a mixer 52. The output of mixer 52 is connected to a low-pass filter 54, which in turn is connected to an intermediate frequency (IF) chain 56. The output of IF chain 56 is connected to an analog-to-digital converter (ADC) 58, which then provides input to processing module 32 of FIG. 2.

Three important frequencies in FIG. 4 are the RF frequency where the adjacent power level is to be measured, the local oscillator (LO) frequency which is varied as needed to tune the receiver, and intermediate frequency (IF) which is fixed. The LO frequency is found by LO=RF−IF.

More particularly, as shown in FIG. 1, the RF input of receiver 18 is coupled off the output of power amplifier 16 by coupler 17. This wide-band RF signal is down-converted to an intermediate frequency (IF) at mixer 52, where IF=RF−LO. The LO frequency for mixer 52 is generated by a phase-locked loop (PLL) frequency synthesizer 50. This LO frequency is set by (digital) tuning commands from a microprocessor (e.g., processing module 32 of FIG. 2).

Low-pass filter 54 is used to filter the RF+LO frequency products, as well as the RF and LO feed-through, and any higher frequency products produced by mixer 52. The receiver IF chain 56 is shown as a single block in FIG. 4. In one implementation, IF chain 56 actually includes amplifiers and a narrow bandpass filter, which assures that the power being measured is truly the power at the tuned frequency and does not contain power from, for example, the main CDMA carrier. IF chain 56 produces a Received Signal Strength Indicator (RSSI) voltage output that is proportional to the IF power, which in turn is proportional to the RF power. The RSSI voltage is sampled by ADC 58, where the resulting digitized RSSI is a digital word (which represents the power level at the tuned frequency) that is used by the optimization algorithm implemented by processing module 32 of FIG. 2.

In some implementations, the optimization algorithm monitors the spurious emissions at multiple frequency points, in which case, the single-channel receiver of FIG. 4 may be re-tuned for each different frequency. This re-tuning can be done with a procedure similar to the following:

A microprocessor (e.g., processing module 32) sends a tuning command to the frequency synthesizer to set the LO frequency (and therefore the receiver's tuned frequency).

The microprocessor waits for the PLL and RSSI to settle.

The digitized RSSI value is read by the microprocessor. Multiple readings could be taken if an average RSSI is used.

These steps are repeated for the next frequency.

The pre-distortion technique of the '490 application was designed to correct for at least some of the non-linearities of the amplifier by pre-distorting both the magnitude of the baseband signal (primarily achieved using the parameter A) as well as the phase (primarily achieved using the parameter B). There are, however, applications where the characteristics of the signal (ratio of peak power to average power close to 1, as in a single-channel TDMA system) do not allow substantial expansion of the magnitude so that the magnitude non-linearity of the amplifier cannot be corrected as fully as might be desired. In these applications substantial improvement can be obtained by correcting the phase as much as possible (via the parameter B) and correcting the magnitude partially by appropriate setting of the $A_m$ value.

Frequency-Dependent Magnitude and Phase Pre-Distortion

As described in the previous section, the pre-distortion technique of the '490 application can be used to achieve a substantial reduction in spurious emissions, but it is frequently observed that some residual spurious emissions are still present. Attempts to reduce these residual spurious emissions by modifying the coefficients in Equations (4) to (7) (or in Equation (4') to (7')) result in an asymmetrical situation where a reduction in the spurious emissions on the low-frequency side of a communication channel are accompanied by an increase in the spurious emissions on the high-frequency side of the channel, and vice-versa, resulting in an overall degradation—or at least no overall improvement—in performance.

According to embodiments of the present invention, in order to reduce the spurious emissions to a level lower than that achieved by the (frequency-independent) pre-distortion technique of the '490 application, pre-distortion, whose magnitude and phase are frequency-dependent, is also applied.

The distortion caused by an amplifier can be considered to be made up of two parts. The first part, which is independent of the signal bandwidth and which is addressed by the '490 application (and other conventional frequency-independent pre-distortion techniques), is associated with the curvature of the amplifier's transfer function which leads to AM—AM (amplitude to amplitude) and AM-PM (amplitude to phase) type of distortions. The pre-distortion of the '490 application effectively deals with this part of the amplifier's distortion by correcting the curvature of the transfer function.

The second part of the amplifier distortion is negligible for narrow bandwidth signals, but it becomes increasingly important as the bandwidth increases. This part of the amplifier distortion has a magnitude that is proportional to the frequency offset from the carrier frequency and a phase shift of ±90° on either side of the carrier frequency. Since these characteristics match those of a differentiator, a thorough correction of this part of the amplifier's distortion can be achieved using a differentiating filter circuit.

The combination of the two corrections can be expressed by Equation (9) as follows:

$$I'+jQ'=(I+jQ)(A+jB)+d\{(I+jQ)(X+jY)\}/dt \quad (9)$$

where I and Q are the in-phase and quadrature components of the input signal before pre-distortion, I' and Q' are the corresponding components after pre-distortion, j is the square root of −1, and A, B, X, and Y, which are functions of the instantaneous power P($P=I^2+Q^2$), are pre-distortion parameters. The symbol d/dt represents differentiation with respect to time. The first term on the right hand side of Equation (9) represents the bandwidth-independent part of the pre-distortion, while the second term represents the bandwidth-dependent part. The second term can be expanded into Equation (10) as follows:

$$d\{(I+jQ)(X+jY)\}/dt=d(I_d+jQ_d)/dt=d(I_d)/dt+jd(Q_d)/dt, \quad (10)$$

where $(I_d+jQ_d)=(I+jQ)(X+jY)$. Furthermore, the derivatives can be approximated as follows:

$$d(I_d)/dt \approx \delta I_d/\delta t, \ d(Q_d)/dt \approx \delta Q_d/\delta t \quad (11)$$

for time increments δt much smaller than the reciprocal of the signal bandwidth.

The pre-distortion parameters A, B, X, and Y can be expressed as polynomials, if desired, according to Equations (12)–(15) as follows:

$$A=a_0+a_1P+a_2P^2+a_3P^3+ \quad (12)$$

$$B=b_1P+b_2P^2+b_3P^3+ \quad (13)$$

$$X=x_1P+x_2P^2+x_3P^3+ \quad (14)$$

$$Y=y_1P+y_2P^2+y_3P^3+ \quad (15)$$

Note that a term independent of P appears in Equation (12), but it does not appear in Equation (14). The power-independent term $a_0$ is in Equation (12), because the output of the first term on the right hand side of Equation (9) (i.e., the main pre-distortion signal) contains the original input signal as well as a pre-distortion signal, but an analogous term does not appear in Equation (14), because the output of the second term on the right hand side of Equation (9) (i.e., the secondary pre-distortion signal) is a pre-distortion signal only.

Figure 5:
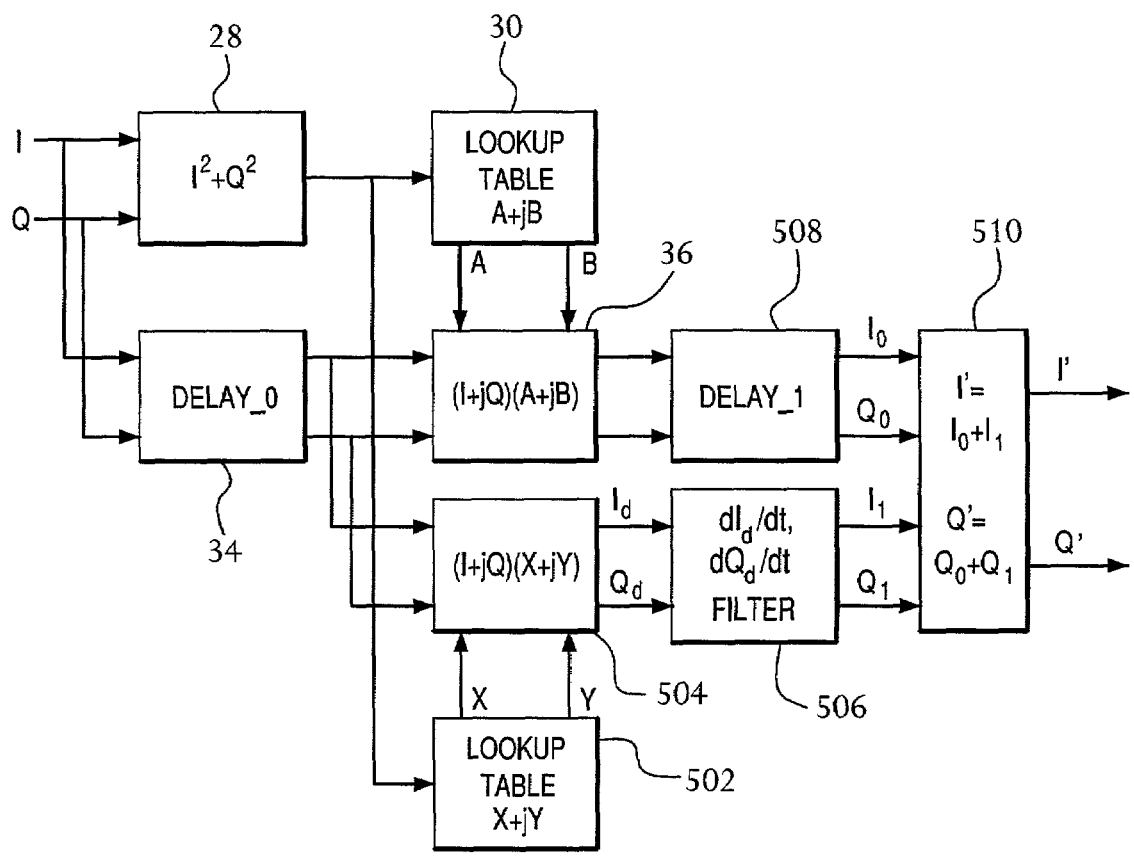
FIG. 5 shows a block diagram of one possible baseband-domain implementation of a pre-distorter having a pre-distortion component whose magnitude and phase are frequency-dependent in conjunction with the frequency-independent pre-distortion component described in the '490 application.

Frequency-Dependent Magnitude and Phase Pre-Distortion in the Baseband Domain FIG. 5 shows a block diagram of a hardware (e.g., FPGA, ASIC, or DSP) implementation in which a secondary pre-distortion signal, whose magnitude and phase are frequency-dependent, is combined with the main pre-distortion signal generated in accordance with the '490 application. In particular, index calculating module 28, look-up table 30, delay 34, and output module 36 of pre-distorter 12 of FIG. 2 are shown as being part of the configuration of FIG. 5 that generates the first term on the right-hand side of Equation (9) (i.e., the main pre-distortion signal $I_0$, $Q_0$). In addition, in FIG. 5, look-up table 502 retains values for the parameters X and Y that are accessed based on the index generated by module 28 and then used by complex multiplication module 504 and differentiating filter 506 to calculate the second term on the right-hand side of Equation (9) (i.e., the secondary pre-distortion signal $I_1$, $Q_1$).

Delay block 34 compensates for the time required to compute the value of ($I^2+Q^2$) by module 28 and retrieve values of A, B, X, and Y from look-up tables 30 and 502. The output of module 36 is further delayed by delay block 508 to compensate for the time required by differentiating filter 506 to convert the output of module 504 into the secondary pre-distortion signal (i.e., the time to compute the time derivatives of $I_d$ and $Q_d$ as in Equation (10)). The main pre-distortion signal ($I_0$, $Q_0$) is then combined with the secondary pre-distortion signal ($I_1$, $Q_1$) in combiner module 510 to generate the new, combined pre-distorted signal (I', Q'), which may then be modulated and amplified (e.g., by modulator 14 and amplifier 16 of FIG. 1) for transmission.

In FIG. 5, both sets of polynomial equations for A and B and for X and Y (i.e., Equations (12)–(15)) are shown implemented as pre-computed look-up tables (i.e., 30 and 502). In alternative implementations, look-up table 30 and/or look-up table 502 can be replaced by real-time computations based on the polynomials in Equations (12)–(15). In either case, depending on the application, the "infinitely long" polynomials in Equations (12)–(15) can be approximated by ignoring higher-order terms. For example, in one preferred implementation, Equations (12) and (13) are approximated by ignoring all terms higher than the third-order terms, while Equations (14) and (15) are approximated by ignoring all terms higher than the first-order terms. As for the coefficients used to generate A and B, the coefficients used to generate X and Y may be generated and adaptively updated using the simplex algorithm.

The differentiation operation of filter 506 can be implemented in a variety of ways. One approach is to approximate the derivative by the difference between adjacent samples according to Equation (16) as follows:

$$(\delta I_d)_n = \{(I_d)_{n+1} - (I_d)_{n-1}\}/2, (\delta Q_d)_n = \{(Q_d)_{n+1} - (Q_d)_{n-1}\}/2, \quad (16)$$

where the subscript outside the parentheses refers to the sample number. This approximation is valid provided the sampling frequency is much greater than the signal bandwidth. Division by $\delta t$ is not necessary, since this division would introduce a scaling factor that can be incorporated into the look-up table or the polynomials for X and Y.

Differentiating filter 506 can be implemented by incorporating the operations of Equation (16) into a single finite impulse response (FIR) filter with the following coefficients (valid for sampling frequencies much higher than the signal bandwidth):

$$[c_1, c_2, c_3] = [0.5, 0, -0.5] \quad (17)$$

Figure 6:
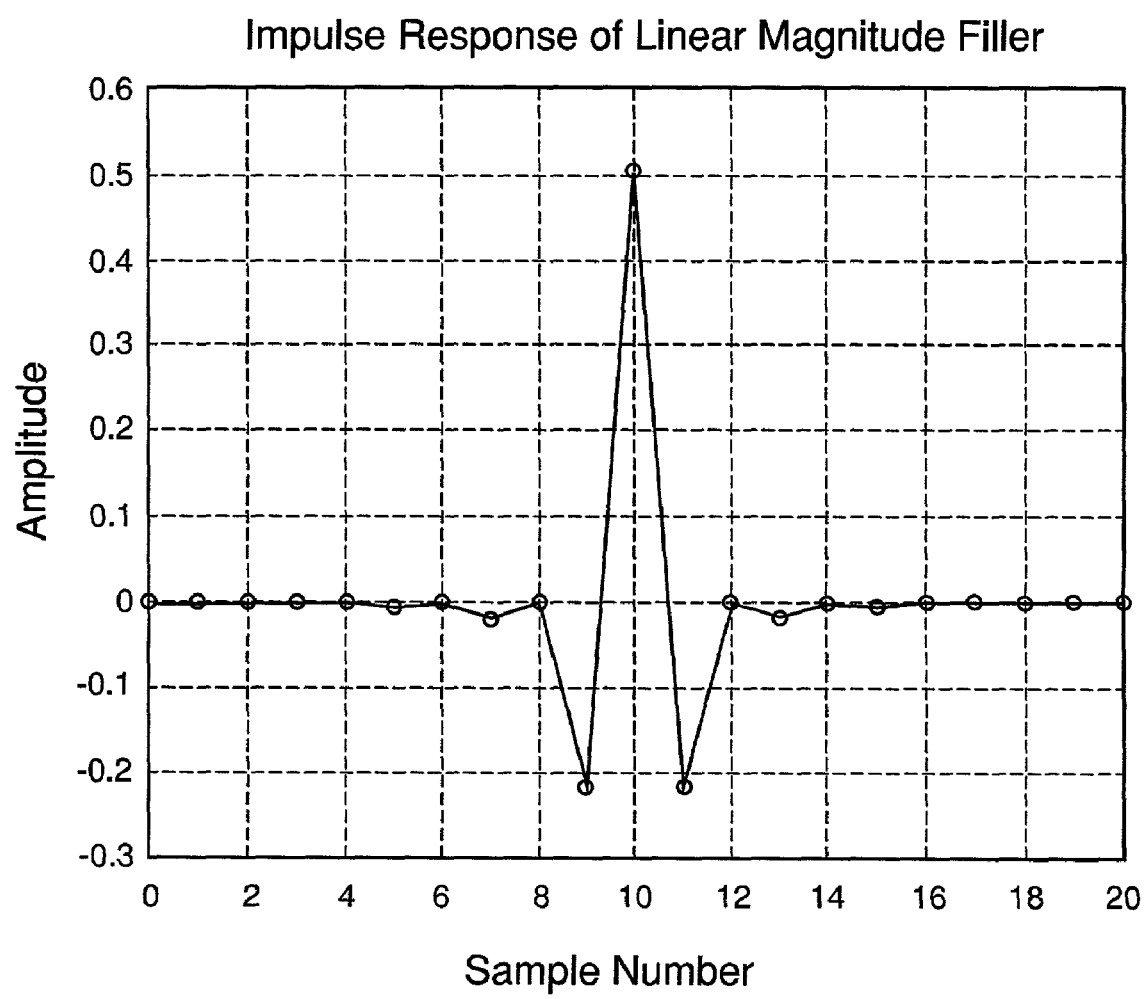
FIG. 6 shows the impulse response of a linear magnitude filter for the differentiating filter for the pre-distorter of FIG. 5.
Figure 7:
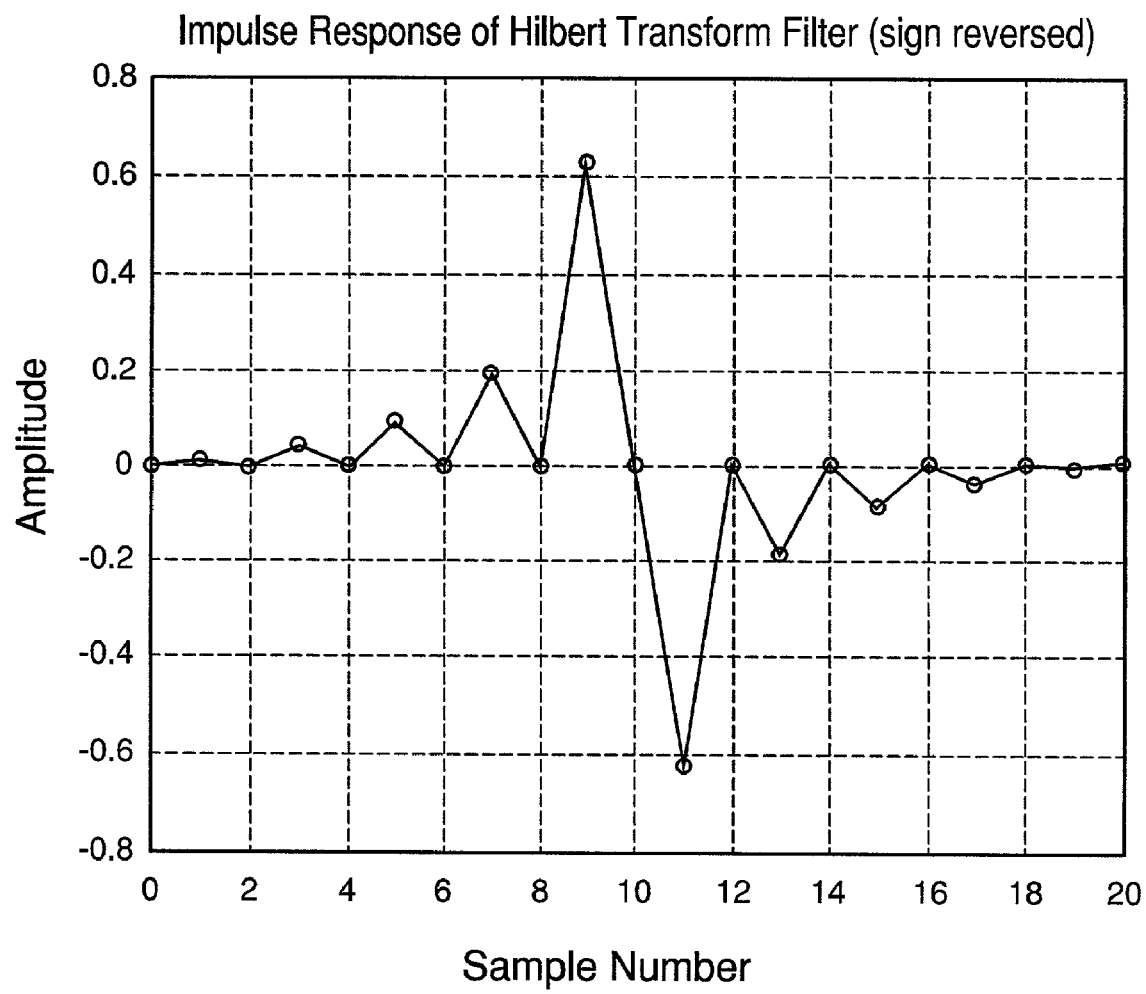
FIG. 7 shows the impulse response of a Hilbert transform filter for the differentiating filter for the pre-distorter of FIG. 5.

Alternatively, the characteristics of a differentiator, namely a magnitude which is proportional to the frequency offset from the carrier and a phase shift of ±90° on either side of the carrier frequency can be implemented by a cascade (i.e., a series combination) of two filters, each of which is either an FIR or IIR (infinite impulse response) filter, where one filter is a linear magnitude filter having constant delay and a magnitude response that is proportional to frequency and the other filter is a Hilbert transform filter (with the sign of the coefficients reversed to conform to the definition of a differentiator) whose magnitude response is constant with frequency and whose phase response is 90° at all frequencies (in addition to a constant delay). FIGS. 6 and 7 show representative impulse responses of a linear magnitude FIR filter and a Hilbert transform FIR filter, respectively, that can be combined to form differentiating filter 506. Note that differentiating filter 506 can be implemented with the linear magnitude filter before or after the Hilbert transform filter.

Figure 8:
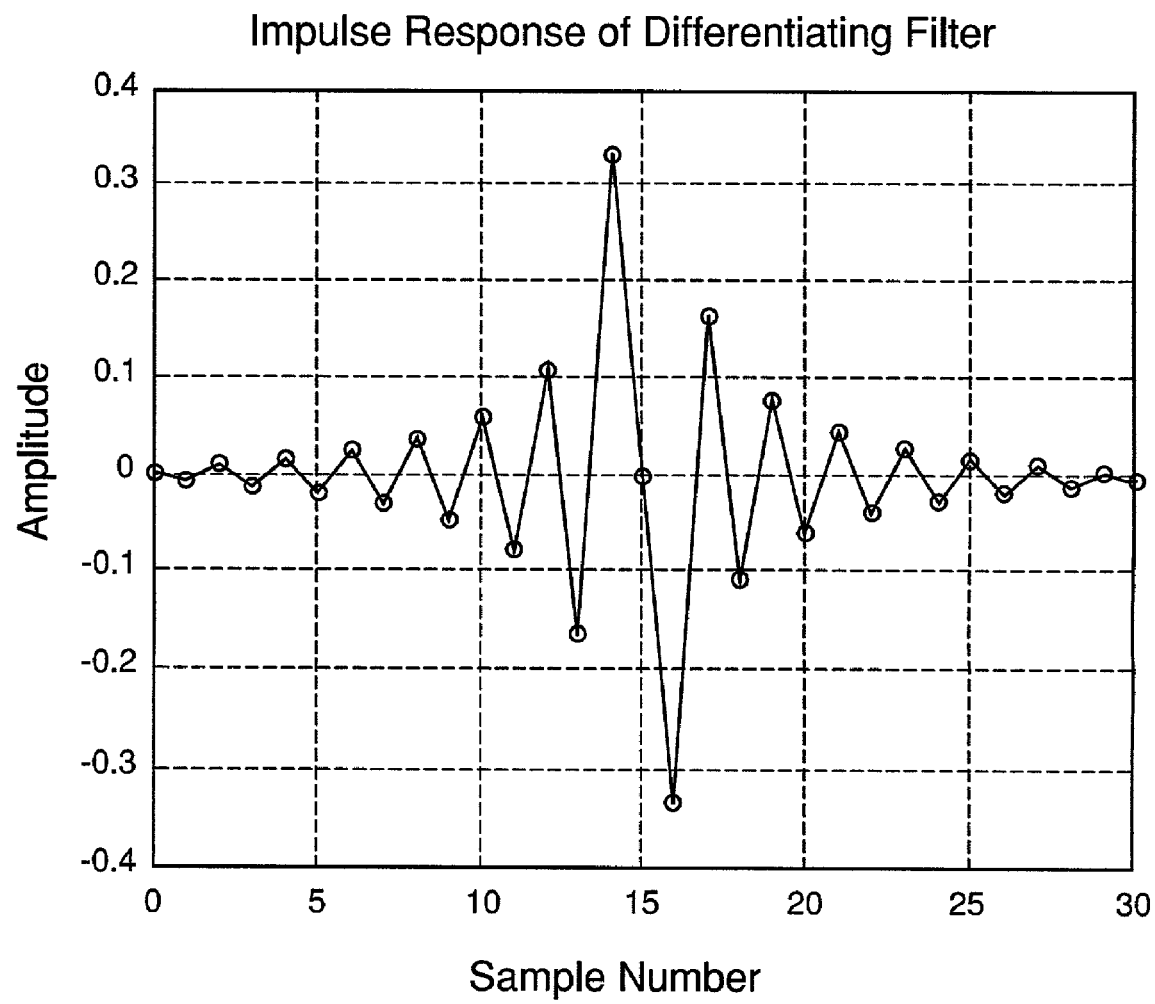
FIG. 8 shows the impulse response of a single-filter implementation of the differentiating filter for the pre-distorter of FIG. 5.

In yet another possible implementation, the desired characteristics can be obtained using a single filter with some compromise in the accuracy of the linear magnitude and the 90° phase shift. FIG. 8 shows a representative impulse response of a single differentiating FIR filter. The sampling frequency of this single filter can be, but does not have to be much higher than the signal bandwidth.

Using the filter coefficients of Equation (17) results in a simple implementation that yields excellent results provided the sampling frequency is at least eight times the signal bandwidth. Using a cascade of two filters provides more flexibility, since the two filters can be tailored to create a magnitude and phase response that matches that of the amplifier in the event the amplifier has a magnitude response that is not linear and/or a phase response that is not 90° or that varies with frequency (in which case, a Hilbert transform filter would not be used).

Figure 5A:
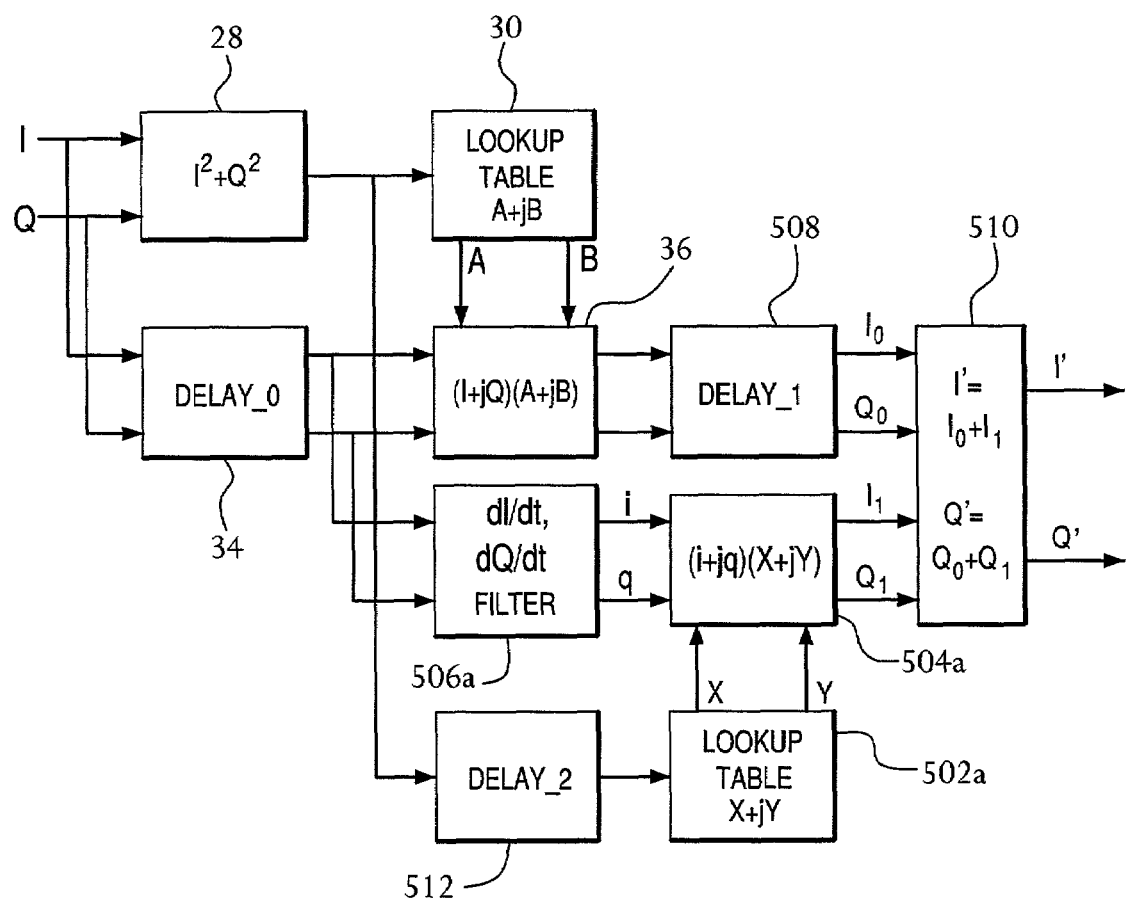
FIG. 5A shows a block diagram of a hardware implementation similar to that of FIG. 5, except that the order of the complex multiplication and differentiation steps in the secondary signal processing path is reversed.

FIG. 5A shows a block diagram of a hardware implementation similar to that of FIG. 5, except that the order of the complex multiplication and differentiation steps in the secondary signal processing path is reversed. In particular, in FIG. 5A, differentiating filter 506a is placed before complex multiplication block 504a. In order to compensate for the time required to perform the differentiation, this implementation includes an additional delay block 512. Given the order of the complex multiplication and differentiation steps in FIG. 5A, the address pointer into lookup table 502a would be expected to be $(i^2+q^2)$ as derived from the values i and q generated by differentiating filter 506a. Nevertheless, sufficiently good results may be achieved using the address pointer $(I^2+Q^2)$ for lookup table 502a, which pointer is already generated by index calculating module 28, thereby avoiding the extra computation involved in generating $(i^2+q^2)$.

Frequency-Dependent Magnitude and Phase Pre-Distortion in a Non-Baseband Domain

The embodiments of FIGS. 5 and 5A are designed to operate in the baseband domain for situations where the baseband signals I and Q are available. When the baseband signals are not readily available, it may be advantageous to apply pre-distortion to the input signal in a non-baseband domain, such as the RF or IF domain. In particular, the differentiation operation of Equation (10) can be implemented in a non-baseband domain by noting that a time derivative can be approximated by the difference between a waveform and a time-delayed version of the waveform, provided the time delay is much shorter than the reciprocal of the signal bandwidth, according to Equation (18) as follows:

$$\delta(I_d+jQ_d)_t = \{(I_d+jQ_d)_{t+\delta t} - (I_d+jQ_d)_{t-\delta t}\}/2, \quad (18)$$

where the subscripts indicate the time relationship of the waveforms. Division by $\delta t$ is not necessary, since this division would introduce a scaling factor that can be incorporated into the look-up table or the polynomials for X and Y.

Figure 9:
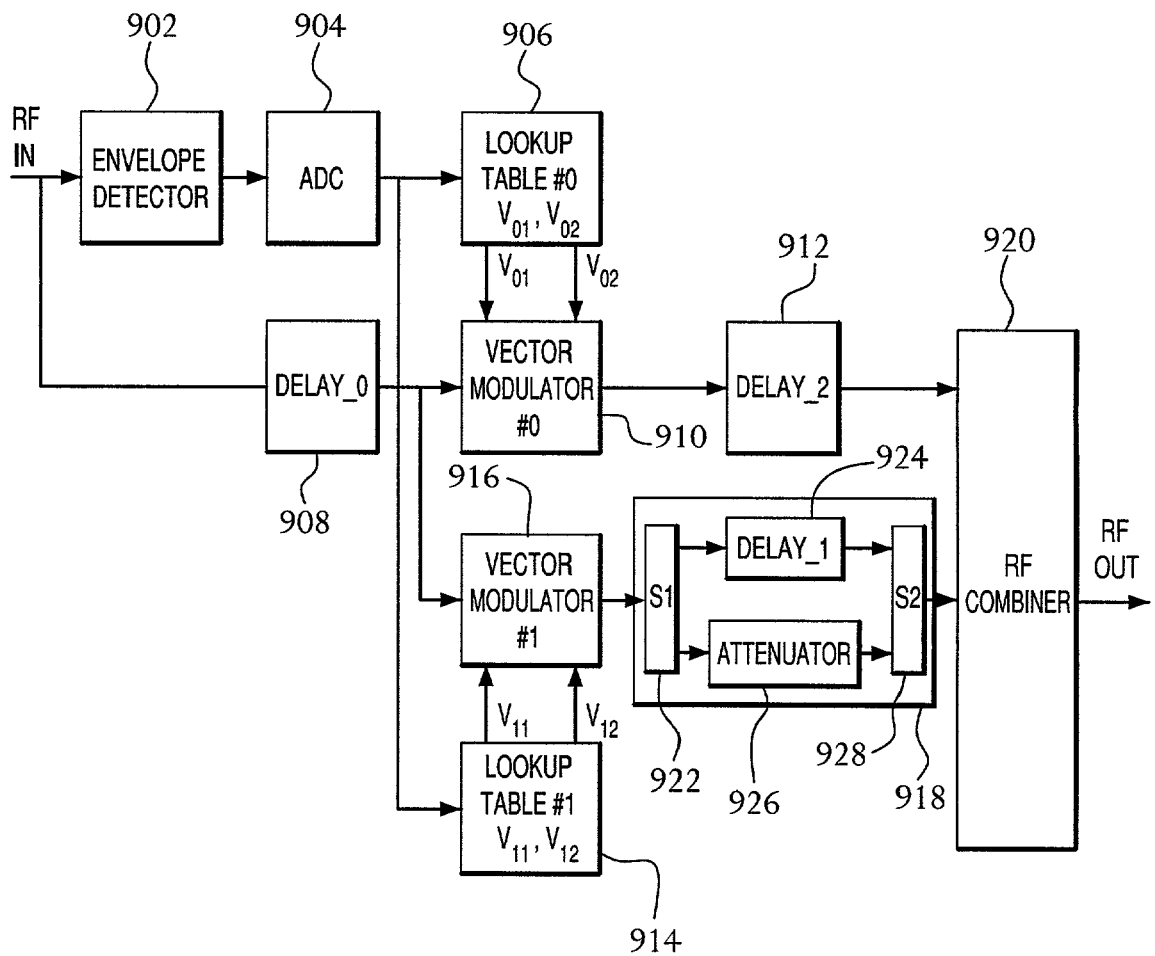
FIG. 9 shows a block diagram of one possible RF-domain implementation of a pre-distorter having a pre-distortion component whose magnitude and phase are frequency-dependent in conjunction with a frequency-independent pre-distortion component.

FIG. 9 shows a block diagram of a possible RF-domain hardware implementation of a pre-distorter. There is a general one-to-one correspondence between modules in the RF implementation of FIG. 9 and the modules in the baseband implementation of FIG. 5.

In particular, in FIG. 9, the RF input signal is split into two paths, one of which goes to envelope detector 902, which produces an output signal proportional to the instantaneous envelope power of the RF input signal. (Alternatively, a signal proportional to the instantaneous magnitude of the RF input signal could be used with the appropriate change in the values stored in the lookup tables.) This signal is digitized by ADC 904, whose digital output is used to fetch a pair of control signal values (e.g., voltages $V_{O1}$ and $V_{O2}$) from look-up table 906. The pair of control signals is applied to vector modulator 910, whose function is to modify the magnitude and phase of the RF signal in accordance with the control signals. The second RF input signal path goes to delay element 908 (e.g., a length of coaxial cable), which causes the RF signal to arrive at vector modulator 910 at the same time as the control signals $V_{O1}$ and $V_{O2}$. Depending on the implementation, compensation can be, but does not have to be provided for attenuation in delay element 908. The output of vector modulator 910 is delayed by delay element 912 to generate the main RF pre-distortion signal analogous to $I_0$, $Q_0$ in FIG. 5.

The output of ADC 904 is split into two digital signal paths corresponding to look-up tables 906 and 914, and the output of delay element 908 is split into two RF signal paths corresponding to vector modulators 910 and 916. Look-up table 914, vector modulator 916, and differentiating circuit 918 provide the secondary RF pre-distortion signal analogous to $I_1$, $Q_1$ in FIG. 5. In particular, look-up table 914 and vector modulator 916 implement the term $(I+jQ)(X+jY)$ on the right hand side of Equation (9).

As shown in FIG. 9, differentiating circuit 918 is implemented using a splitter 922, a delay element 924, an attenuator 926, and a combiner 928, which together implement the differentiation operation with respect to time using the approximation of Equation (18) (division by 2 is not required because the values in look-up table 914 can be adjusted appropriately). Splitter 922 splits the RF signal generated by vector modulator 916 into two RF signal paths, one of which is applied to delay element 924, which delays the RF signal, and the other to attenuator 926, which attenuates the RF signal to compensate for the attenuation of delay element 924. Combiner 928 combines the RF signals from delay element 924 and attenuator 926 to generate the secondary pre-distortion signal. Splitter 922 and combiner 928 are designed to impart a 180° rotation between the two RF signals so that the delayed signal from delay element 924 is subtracted from the attenuated signal from attenuator 926. Such a rotation can be achieved by using a 90° splitter and a 90° combiner. Alternatively, a 0° splitter and a 180° combiner, or vice-versa, or any other suitable combination of a splitter and a combiner, can be used.

The delay introduced by delay element 912 is one half that introduced by delay element 924, thus positioning the output of vector modulator 910 half way in time between the two signals at the inputs of combiner 928. The delay introduced by delay element 924 should be much smaller than the reciprocal of the signal bandwidth. A value equal to or less than one fifth of the reciprocal of the signal bandwidth gives excellent results.

Vector modulator 910 is configured such that, in the absence of control signal inputs, the RF signal passes through without (or with minimal) distortion, whereas vector modulator 916 is configured such that, in the absence of control signal inputs, little or no RF signal passes through. Thus, when control signals are applied, vector modulator 910 produces the original RF signal plus a pre-distortion signal, whereas vector modulator 916 produces essentially a pre-distortion signal only.

The main pre-distortion signal from delay element 912 and the secondary pre-distortion signal from combiner 928 are combined together by an RF combiner 920, where the combined signal constitutes the pre-distorted RF output signal that is applied to the amplifier.

Since, in the RF implementation of FIG. 9, the input signal is pre-distorted in the RF domain, a modulator similar to IQ modulator 14 of FIG. 1 may be omitted. In other implementations in which the input signal is pre-distorted at a lower frequency (e.g., in the IF domain), a mixer would be needed to convert the resulting pre-distorted IF signal to the RF domain prior to being applied to the amplifier.

In the implementation shown in FIG. 9, the parameters A and B, and X and Y, are shown implemented as look-up tables. Alternatively, they can be evaluated in real time by computing the values of the polynomials in Equations (12) to (15). In either case, the coefficients used to generate A, B, X, and Y may be generated and adaptively updated using the simplex algorithm.

Figure 9A:
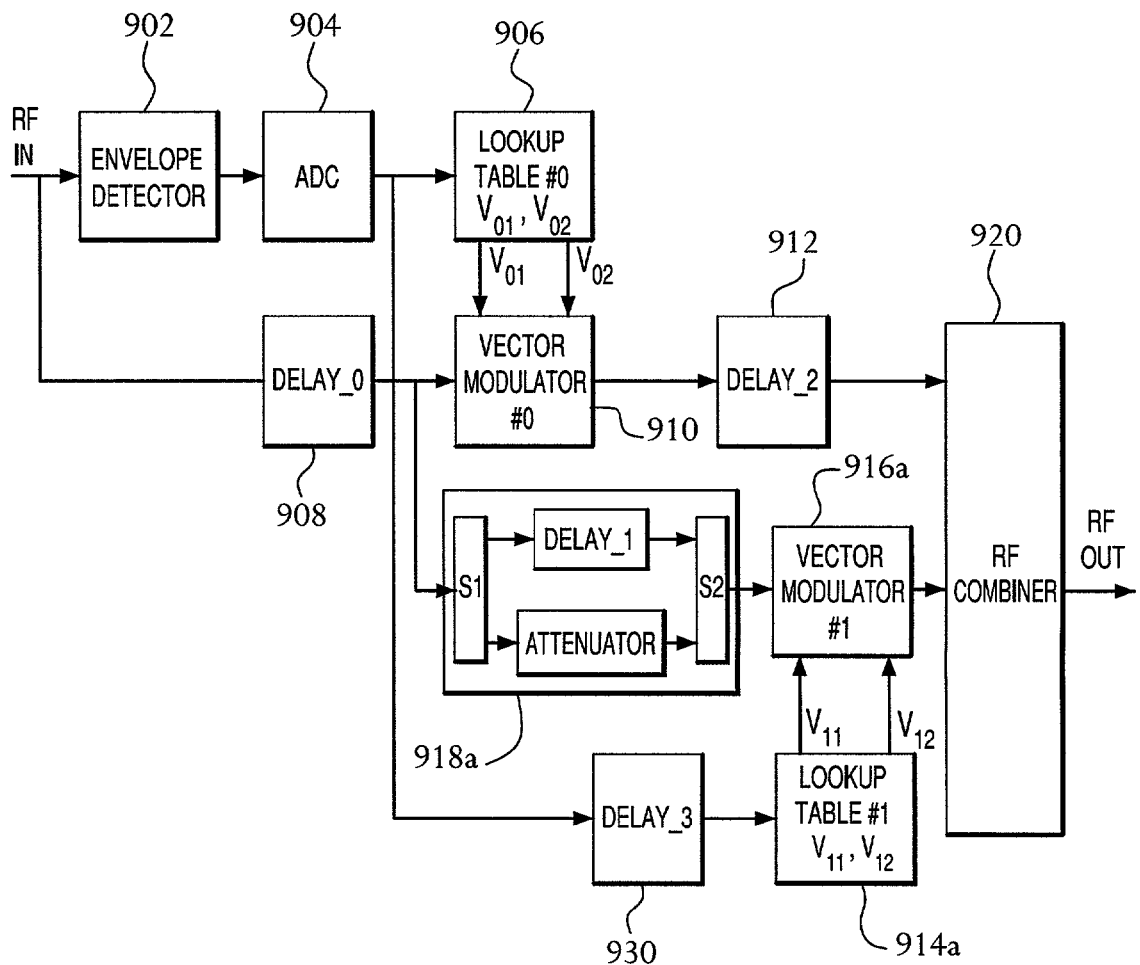
FIG. 9A shows a block diagram of a hardware implementation similar to that of FIG. 9, except that the order of the complex multiplication and differentiation steps in the secondary signal processing path is reversed.

FIG. 9A shows a block diagram of a hardware implementation similar to that of FIG. 9, except that the order of the complex multiplication and differentiation steps in the secondary signal processing path is reversed. In particular, in FIG. 9A, differentiating circuit 918a is placed before vector modulator 916a. In order to compensate for the time required to perform the differentiation, this implementation includes an additional delay block 930. Note that, in preferred embodiments, the index value generated by ADC 904 is used to access values for parameters $V_{11}$ and $V_{12}$ from lookup table 914a.

Alternative Embodiments

Depending on the particular application, the configurations shown in FIGS. 5, 5A, 9, and 9A can be implemented in the context of circuitry that includes modules analogous to equalization filter 20, clipping module 22, low-pass filter 24, and sampling module 26 of FIG. 2. In alternative implementations of the present invention, one or more—and even all—of these components may be omitted and/or one or more other processing components may be included, depending on the characteristics of the input signals and the requirements of the particular communication network.

Although the present invention has been described in the context of configurations in which frequency-dependent magnitude and phase pre-distortion of the present invention is combined with the (frequency-independent) magnitude and phase pre-distortion of the '490 application, the present invention is not so limited. In particular, it is possible to perform frequency-dependent magnitude and phase pre-distortion of the present invention without performing the pre-distortion of the '490 application. In that case, the configurations shown in FIG. 5, for example, could be modified by omitting look-up table 30 and output module 36 and passing a copy of the delayed input signal from delay block 34 directly to delay block 508, while retaining the processing of look-up table 502 and module 504.

It is also possible to implement frequency-dependent magnitude pre-distortion without implementing frequency-dependent phase pre-distortion, with or without the frequency-independent pre-distortion of the '490 application. In that case, the configuration shown in FIG. 5, for example, could be modified such that filter 506 is implemented using only a linear magnitude filter, as in FIG. 6.

Although the present invention has been described in the context of wireless signals transmitted from a base station to one or more mobile units of a wireless communication network, the present invention is not so limited. In theory, embodiments of the present invention could be implemented for wireless signals transmitted from a mobile unit to one or more base stations. The present invention can also be implemented in the context of other wireless and even wired communication networks to reduce spurious emissions.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium or loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for reducing spurious emissions in an amplified signal, comprising the steps of:
    (a) receiving an input signal; and
    (b) applying pre-distortion to the input signal to generate a pre-distorted signal, such that, when the pre-distorted signal is applied to an amplifier to generate the amplified signal, the pre-distortion reduces spurious emissions in the amplified signal, wherein step (b) comprises the steps of:
        (1) generating a main pre-distortion signal from the input signal;
        (2) generating a secondary pre-distortion signal, whose magnitude and phase are frequency-dependent, from the input signal; and
        (3) combining the main pre-distortion signal and the secondary pre-distortion signal to generate the pre-distorted signal, wherein the secondary pre-distortion signal has:
    a magnitude proportional to a frequency offset from a carrier frequency of the input signal;
    a phase shift of +90 degrees on one side of the carrier frequency; and
    a phase shift of −90 degrees on the other side of the carrier frequency.

2. The invention of claim 1, wherein the input signal is a baseband signal and the pre-distortion is applied in the baseband domain.

3. The invention of claim 1, wherein step (b)(1) comprises the step of applying pre-distortion, whose magnitude and phase are frequency-independent, to the input signal to generate the main pre-distortion signal.

4. The invention of claim 1, wherein the secondary pre-distortion signal is dependent on the bandwidth of the input signal.

5. The invention of claim 1, wherein the secondary pre-distortion signal is based on a temporal differentiation of a signal generated from the input signal.

6. The invention of claim 5, wherein the temporal differentiation is applied to a signal generated by complex multiplication between the input signal and a complex parameter dependent on the power of the input signal.

7. The invention of claim 5, wherein the temporal differentiation is applied to the input signal prior to complex multiplication between the resulting differentiated signal and a complex parameter dependent on the power of the input signal.

8. The invention of claim 1, wherein the frequency-dependent pre-distortion is based on data retrieved from a look-up table.

9. The invention of claim 8, wherein the look-up table is adaptively updated according to control signals generated based on the amplified signal.

10. An apparatus for reducing spurious emissions in an amplified signal, wherein the apparatus comprises:
    (a) a main signal processing path configured to generate a main pre-distortion signal from an input signal;
    (b) a secondary signal processing path configured to generate a secondary pre-distortion signal from the input signal, wherein the magnitude and phase of the secondary pre-distortion signal are frequency-dependent; and
    (c) a combiner configured to combine the secondary pre-distortion signal with the main pre-distortion signal to generate a pre-distorted signal, such that, when the pre-distorted signal is applied to an amplifier to generate the amplified signal, the pre-distortion reduces spurious emissions in the amplified signal, wherein the secondary pre-distortion signal has:
    a magnitude proportional to a frequency offset from a carrier frequency of the input signal;
    a phase shift of +90 degrees on one side of the carrier frequency; and
    a phase shift of −90 degrees on the other side of the carrier frequency.

11. The invention of claim 10, wherein the input signal is a baseband signal and the apparatus applies the pre-distortion in the baseband domain.

12. The invention of claim 10, wherein the main signal processing path is configured to apply frequency-independent magnitude and phase pre-distortion to the input signal to generate the main output signal.

13. The invention of claim 10, wherein the secondary signal processing path comprises:
    (1) a complex multiplication module configured to multiply the input signal by a complex parameter dependent on the power of the input signal; and
    (2) a differentiating filter configured to differentiate the output of the complex multiplication module to generate the secondary pre-distortion signal.

14. The invention of claim 13, wherein the differentiating filter comprises a cascade combination of a linear magnitude filter and a Hilbert transform filter.

15. The invention of claim 13, wherein the differentiating filter is implemented using a single FIR or IIR filter.

16. The invention of claim 10, wherein the secondary signal processing path comprises:
    (1) a differentiating filter configured to differentiate the input signal; and
    (2) a complex multiplication module configured to multiply the output of the differentiating filter by a complex parameter dependent on the power of the input signal to generate the secondary pre-distortion signal.

17. The invention of claim 10, wherein the apparatus retrieves data for the frequency-dependent pre-distortion from a look-up table.

18. The invention of claim 17, wherein the apparatus adaptively updates the look-up table according to control signals generated based on the amplified signal.

19. A method for reducing spurious emissions in an amplified signal, comprising the steps of:
    (a) receiving an input signal; and
    (b) applying pre-distortion to the input signal to generate a pre-distorted signal, such that, when the pre-distorted signal is applied to an amplifier to generate the amplified signal, the pre-distortion reduces spurious emissions in the amplified signal, wherein step (b) comprises the steps of:
        (1) generating a main pre-distortion signal, whose magnitude and phase are frequency-independent, from the input signal;

(2) generating a secondary pre-distortion signal, whose magnitude and phase are frequency-dependent, from the input signal; and (3) combining the main pre-distortion signal and the secondary pre-distortion signal to generate the pre-distorted signal, wherein the secondary pre-distortion signal is based on a temporal differentiation of a signal generated from the input signal.

20. The invention of claim 19, wherein the temporal differentiation is applied to a signal generated by complex multiplication between the input signal and a complex parameter dependent on the power of the input signal.

21. The invention of claim 20, wherein:
the complex multiplication is applied to (i) the input signal and (ii) parameters retrieved from a look-up table using an index value based on the envelope of the input signal; and
the signal generated by the complex multiplication is temporally differentiated to generate the secondary pre-distortion signal.

22. The invention of claim 19, wherein the temporal differentiation is applied to the input signal prior to complex multiplication between the resulting differentiated signal and a complex parameter dependent on the power of the input signal.

23. The invention of claim 22, wherein:
the complex multiplication is applied to (i) the result of temporally differentiating the input signal and (ii) parameters retrieved from a look-up table using an index value based on the envelope of the input signal; and
the signal generated by the complex multiplication is the secondary pre-distortion signal.

24. An apparatus for reducing spurious emissions in an amplified signal, wherein the apparatus comprises:
(a) a main signal processing path configured to generate a main pre-distortion signal from an input signal, wherein the magnitude and phase of the main pre-distortion signal are frequency-independent;
(b) a secondary signal processing path configured to generate a secondary pre-distortion signal from the input signal, wherein the magnitude and phase of the secondary pre-distortion signal are frequency-dependent; and
(c) a combiner configured to combine the secondary pre-distortion signal with the main pre-distortion signal to generate a pre-distorted signal, such that, when the pre-distorted signal is applied to an amplifier to generate the amplified signal, the pre-distortion reduces spurious emissions in the amplified signal, wherein the secondary signal processing path comprises:
(1) a complex multiplication module configured to multiply the input signal by a complex parameter dependent on the power of the input signal; and
(2) a differentiating filter configured to differentiate the output of the complex multiplication module to generate the secondary pre-distortion signal.

25. The invention of claim 24, wherein the differentiating filter comprises a cascade combination of a linear magnitude filter and a Hilbert transform filter.

26. The invention of claim 24, wherein the differentiating filter is implemented using a single FIR or IIR filter.

27. An apparatus for reducing spurious emissions in an amplified signal, wherein the apparatus comprises:
(a) a main signal processing path configured to generate a main pre-distortion signal from an input signal, wherein the magnitude and phase of the main pre-distortion signal are frequency-independent;
(b) a secondary signal processing path configured to generate a secondary pre-distortion signal from the input signal, wherein the magnitude and phase of the secondary pre-distortion signal are frequency-dependent; and
(c) a combiner configured to combine the secondary pre-distortion signal with the main pre-distortion signal to generate a pre-distorted signal, such that, when the pre-distorted signal is applied to an amplifier to generate the amplified signal, the pre-distortion reduces spurious emissions in the amplified signal, wherein the secondary signal processing path comprises:
(1) a differentiating filter configured to differentiate the input signal; and
(2) a complex multiplication module configured to multiply the output of the differentiating filter by a complex parameter dependent on the power of the input signal to generate the secondary pre-distortion signal.

* * * * *